United States Patent
Lee et al.

(10) Patent No.: US 7,897,458 B2
(45) Date of Patent: Mar. 1, 2011

(54) METHOD OF FORMING FLOATING GATE, NON-VOLATILE MEMORY DEVICE USING THE SAME, AND FABRICATING METHOD THEREOF

(75) Inventors: Jaegab Lee, Seoul (KR); Jang-Sik Lee, Seoul (KR); Chi Young Lee, Seoul (KR); Byeong Hyeok Sohn, Seoul (KR)

(73) Assignee: Kookmin University Industry Academy Cooperation Foundation, Seoul (KR)

( * ) Notice: Subject to any disclaimer, the term of this patent is extended or adjusted under 35 U.S.C. 154(b) by 228 days.

(21) Appl. No.: 12/076,878

(22) Filed: Mar. 25, 2008

(65) Prior Publication Data

US 2008/0237692 A1 Oct. 2, 2008

(30) Foreign Application Priority Data

Mar. 29, 2007 (KR) .................. 10-2007-0030850

(51) Int. Cl.
*H01L 21/336* (2006.01)
(52) U.S. Cl. ... 438/260; 438/264; 438/594; 257/E21.682
(58) Field of Classification Search .................. 438/216, 438/260, 261, 287, 288, 591, 264, 594; 257/E21.679, E21.682

See application file for complete search history.

(56) References Cited

U.S. PATENT DOCUMENTS

| | | | |
|---|---|---|---|
| 2009/0148675 A1* | 6/2009 | Sun | 428/206 |
| 2009/0155967 A1* | 6/2009 | Purayath et al. | 438/261 |

FOREIGN PATENT DOCUMENTS

| | | |
|---|---|---|
| KR | 1020050002304 | 7/2005 |
| WO | WO 2005/123373 A2 | 12/2005 |

* cited by examiner

*Primary Examiner* — Mary Wilczewski
*Assistant Examiner* — Toniae M Thomas
(74) *Attorney, Agent, or Firm* — Rosenberg, Klein & Lee

(57) ABSTRACT

Provided is a method of forming a floating gate, a non-volatile memory device using the same, and a method of fabricating the non-volatile memory device, in which nano-crystals of nano-size whose density and size can be easily adjusted, are synthesized using micelles so as to be used as the floating gate of the non-volatile memory device. The floating gate is fabricated by forming a tunnel oxide film on the semiconductor substrate, coating a gate formation solution on the tunnel oxide film in which the gate formation solution includes micelle templates into which precursors capable of synthesizing metallic salts in nano-structures formed by a self-assembly method are introduced, and arranging the metallic salts on the tunnel oxide film by removing the micelle templates, to thereby form the floating gate.

15 Claims, 7 Drawing Sheets

METHOD OF FORMING FLOATING GATE, NON-VOLATILE MEMORY DEVICE USING THE SAME, AND FABRICATING METHOD THEREOF

CROSS-REFERENCE TO RELATED APPLICATION

This application claims the benefit of Korean Patent Application No. 10-2007-0030850, filed on Mar. 29, 2007, in the Korean Intellectual Property Office, the disclosure of which is incorporated herein by reference.

BACKGROUND OF THE INVENTION

1. Field of the Invention

The present invention relates to a method of forming a floating gate, a non-volatile memory device using the same, and a method of fabricating the non-volatile memory device. More particularly, the present invention relates to a method of forming a floating gate, a non-volatile memory device using the same, and a method of fabricating the non-volatile memory device, in which the floating gate which uses nano-crystals of nano-size whose density and size can be easily adjusted, is formed and the nano-crystals are formed using micelles without seeking heat treatment of high-temperature, so that a high-temperature heat treatment process that may raise a problem such as a change in a membranous feature, can be omitted, and an oxide film is formed of a substance having a high dielectric constant, so that a higher electric field can be applied under an identical voltage.

2. Description of the Related Art

According to development of a semiconductor device technology, semiconductor devices, for example, semiconductor memory devices, or thin film transistor-liquid crystal displays (TFT-LCD's) are tending high integrated and miniaturized.

Semiconductor memory devices are largely classified into a volatile memory device such as a dynamic random access memory (DRAM) and a static random access memory (SRAM) in which stored data is lost if electric power is interrupted, and a non-volatile memory device in which stored data is kept even if electric power is temporarily interrupted.

Non-volatile memory devices have a substantially limitless cumulative capacity, respectively. A demand for flash memory devices that enable data to be electrically input and output, for example, an electrically erasable and programmable ROM is increasing.

A flash memory device which is one of non-volatile memory devices can be largely classified into a floating gate type flash memory device and SONOS (Silicon-Oxide-Nitride-Oxide-Semiconductor) type flash memory device according to a charge storing structure.

The floating gate type flash memory device generally has a vertical deposition style multi-layer gate structure having a floating gate on a silicon substrate, and the multi-layer gate structure includes at least one tunnel oxide film or dielectric film, a floating gate formed on the tunnel oxide film, and a control gate formed on the floating gate.

The floating gate type flash memory device applies a proper voltage to the control gate and the substrate, to thus make electrons flow in/drain from the floating gate and to thereby record/delete data. The dielectric film maintains the charges charged in the floating gate.

The SONOS type flash memory device includes a source electrode and a drain electrode which are formed in a silicon substrate, a tunnel oxide film which is deposited on the upper surface of the silicon substrate, a nitride film which is deposited on the upper surface of the tunnel oxide film, an interception oxide film which is formed on the upper surface of the nitride film, and a gate electrode which is formed on the upper surface of the interception oxide film, in which the tunnel oxide film, the nitride film, and the interception oxide film are generally called an ONO (Oxide/Nitride/Oxide) film.

The SONOS type flash memory device can function as a memory device that stores information in which electrons are captured in charge defects formed in the inside of the nitride film formed on the upper surface of the tunnel oxide film. However, it is hard to adjust or control the number of the charge defects of the inside of the nitride film to capture electrons.

Meanwhile, a study tending to use nano-crystals whose particle density and size can be easily controlled as a floating gate in the floating gate type flash memory device is in progress.

In order to form such nano-crystals on a tunnel oxide film of silicon substrate, a high-temperature heat treatment process at 850° C. or higher is needed.

However, when a high-temperature heat treatment process proceeds to form nano-crystals in a silicon substrate, a film quality characteristic of each component (for example, a tunnel oxide film) may change according to an interface reaction and defect. Problems such as components of various film qualities and unnecessary diffusion of ions due to an ion implantation process may occur, to thus deteriorate characteristics of the components.

Therefore, a technology of manufacturing a floating gate type flash memory device that can prevent problems which may be caused by a high-temperature heat treatment process while taking the merits of nano-crystals, by using nano-crystals whose density and size can be easily controlled in a floating gate which floats electric charges, is required.

Meanwhile, a floating gate type flash memory device that can prevent a bridge between gates while sufficiently securing an overlay margin between an active area that is defined in a semiconductor substrate and a floating gate was proposed in Korean Laid-open Patent Publication No. 2005-0002304.

In the case of the technology proposed in Korean Laid-open Patent Publication No. 2005-0002304, an overlay margin between a floating gate and an active area of a semiconductor substrate can be secured at maximum without causing a decrease of a coupling ratio between the floating gate and a control gate, to accordingly enhance reliability of the semiconductor device. However, no method of solving a problem which may be caused by a high-temperature heat treatment process while using nano-crystals as a floating gate is disclosed or taught.

In addition, a method of enhancing characteristics of a memory device should be presented, in which an oxide film having a higher dielectric constant than that of a silicon oxide film or a silicon oxynitride film is used as an oxide film of a non-volatile memory device, so that a larger electric field is applied at an identical voltage.

SUMMARY OF THE INVENTION

To overcome inconveniences of the conventional art, it is an object of the present invention to provide a method of forming a floating gate, a non-volatile memory device using the same, and a method of fabricating the non-volatile memory device, in which metal nano-crystals of nano-size whose density and size are easily controlled and which are self-assembled using micelle templates, is used as a floating gate of a non-volatile memory device.

It is another object of the present invention to provide a method of forming a floating gate, a non-volatile memory device using the same, and a method of fabricating the non-volatile memory device, in which the floating gate can be formed using metal nano-crystals without seeking a high-temperature heat treatment process which may raise a problem such as a change in a membranous feature.

It is still another object of the present invention to provide a non-volatile memory device using the same, and a method of fabricating the non-volatile memory device, in which an oxide film which is a dielectric film is formed of a substance having a high dielectric constant, so that a higher electric field can be applied under an identical voltage.

To accomplish the above object of the present invention, according to an aspect of the present invention, there is provided a method of forming a floating gate on a semiconductor substrate comprising the steps of: forming a tunnel oxide film on the semiconductor substrate; coating a gate formation solution on the tunnel oxide film in which the gate formation solution includes a plurality of micelle templates formed by a self-assembly method wherein precursors capable of synthesizing metallic salts are introduced in the plurality of micelle templates; and arranging the metallic salts on the tunnel oxide film by removing the micelle templates, to thereby form the floating gate.

Preferably but not necessarily, the floating gate formation method removes the micelle templates through a plasma process that applies plasma or a heat treatment process.

Preferably but not necessarily, the floating gate formation method further comprises the step of reducing the metallic salts in the case that the metallic salts have been oxidized through the plasma process or heat treatment process.

Preferably but not necessarily, the step of reducing the metallic salts is performed through any one of a heat treatment process under a hydrogen atmosphere and a process of applying hydrogen plasma.

Preferably but not necessarily, the tunnel oxide film is formed of any one oxide film among a hafnium oxide ($HfO_2$) film, a silicon dioxide ($SiO_2$) film and an aluminum oxide ($Al_2O_3$) film.

Preferably but not necessarily, the precursors are a material that can synthesize the metallic salts formed of any one metal among Co, Fe, Ni, Cr, Au, Ag, Cu, Al, Pt, Sn, W, Ru and Cd.

Preferably but not necessarily, the metallic salts are metal nano-crystals which are synthesized by projecting a micelle polymer that can form the micelle templates by a self-assembly method into a toluene solution including the precursors so that each of the precursors are introduced in each of the micelle templates having a nano-structure.

Preferably but not necessarily, a density of the metal nano-crystals is controlled by controlling a corona block molecular weight or core block molecular weight of the micelle polymer in the floating gate formation method.

Preferably but not necessarily, the floating gate can be applied to a floating gate of a non-volatile memory or a floating electrode of a thin film transistor-liquid crystal display (TFT-LCD).

The gate formation solution can be obtained by projecting a micelle polymer that forms the micelle templates by a self-assembly method into a toluene solution including the precursors, so that each of the precursors are introduced in each of the micelle templates having a nano-structure.

According to another aspect of the present invention, there is provided a process of manufacturing a non-volatile memory device comprising the steps of: forming a tunnel oxide film on a semiconductor substrate; coating a gate formation solution on the tunnel oxide film in which the gate formation solution includes a plurality of micelle templates formed by a self-assembly method wherein precursors capable of synthesizing metallic salts are introduced in the plurality of micelle templates; arranging a plurality of metal nano-crystals synthesized with the metallic salts on the tunnel oxide film by removing the micelle templates; forming a control oxide film on the tunnel oxide film and the metal nano-crystal; and forming a control gate on the control oxide film.

Preferably but not necessarily, the method of manufacturing the non-volatile memory device further comprises the steps of reducing the metallic nano-crystals through a heat treatment process under a hydrogen atmosphere or a hydrogen plasma process in the case that the metal nano-crystals have been oxidized by removing the micelle templates through a plasma process or heat treatment process.

Preferably but not necessarily, the gate formation solution includes the metal nano-crystals which are synthesized by projecting a micelle polymer that can form the micelle templates by a self-assembly method into a toluene solution including the precursors so that the precursors are selectively introduced in respective core blocks of the micelle templates.

Preferably but not necessarily, the precursors are a material that can synthesize the metallic salts formed of any one metal among Co, Fe, Ni, Cr, Au, Ag, Cu, Al, Pt, Sn, W, Ru and Cd.

Preferably but not necessarily, a density of the metal nano-crystals is controlled by controlling a corona block molecular weight or core block molecular weight of the micelle polymers which can be formed by a self-assembly method in the method of manufacturing the non-volatile memory device.

According to still another aspect of the present invention, there is provided a non-volatile memory device comprising: a semiconductor substrate; a tunnel oxide film formed on the semiconductor substrate; a number of metal nano-crystals which are located on tunnel oxide film and are formed by a self-assembly method by a number of micelle templates, each of micelle templates having a nano-structure; a control oxide film formed on the tunnel oxide film and the metal nano-crystals; and a control gate formed on the control oxide film.

Preferably but not necessarily, the tunnel oxide film and the control oxide film in the non-volatile memory device are formed of any one oxide film among a hafnium oxide ($HfO_2$) film, a silicon dioxide ($SiO_2$) film and an aluminum oxide ($Al_2O_3$) film.

Preferably but not necessarily, the metal nano-crystals are obtained by selectively introducing and synthesizing precursors that can synthesize metallic salts into and with the nano-structures of the micelle templates formed by the self-assembly method, and removing the micelle templates through a plasma process or a heat treatment process.

Preferably but not necessarily, the metal nano-crystals are reduced through a heat treatment process under a hydrogen atmosphere or a hydrogen plasma process in the case that the metal nano-crystals have been oxidized through the plasma process or heat treatment process.

Preferably but not necessarily, in the non-volatile memory device, a first area where the metal nano-crystals are not arranged has a metal-oxide-semiconductor (MOS) structure, and a second area where the metal nano-crystals are arranged has a control gate-control oxide film-metal nano-crystal (floating gate)-tunnel oxide film-silicon semiconductor substrate structure.

Preferably but not necessarily, each of the metal nano-crystals is a spherical structure forming a circular shape on plane.

As described above, according to the present invention, a floating gate of a non-volatile memory device can be formed of metal nano-crystals of nano-size, a density of the metal nano-crystals forming the floating gate can be controlled, and the metal nano-crystals of nano-size can be formed into the floating gate without having a high-temperature heat treatment process.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION OF THE INVENTION

Figure 1A:
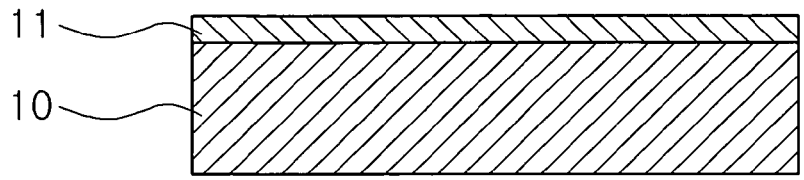
FIGS. 1A to 1H are cross-sectional views for explaining a method of manufacturing a non-volatile memory device according to a preferable embodiment of the present invention, respectively.

Hereinbelow, a method of forming a floating gate, a non-volatile memory device using the same, and a method of fabricating the non-volatile memory device according to the present invention will be described with reference to the accompanying drawings. Like reference numerals are assigned for like elements in the drawings. Here, the present invention will be described using a flash memory device among non-volatile memory devices as an example, but can be applied to the other non-volatile memory devices.

FIGS. 1A to 1H are cross-sectional views for explaining a method of manufacturing a non-volatile memory device according to a preferable embodiment of the present invention, respectively.

Referring to FIG. 1A, a tunnel oxide film 11 is formed on a silicon substrate 10 that is a semiconductor substrate. The tunnel oxide film 11 is formed on an active area of the silicon substrate 10 that is divided into a field area and the active area. Here, it is preferable that the tunnel oxide film 11 is formed of a thickness of 3 to 8 nm to a hafnium oxide film, a silicon dioxide film or a silicon oxynitride oxide film.

Figure 1B:
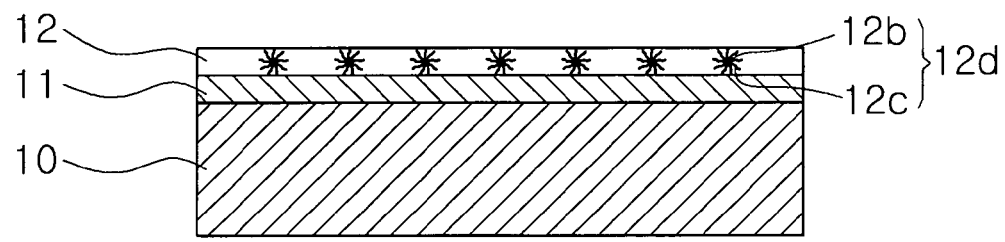
Figure 1C:
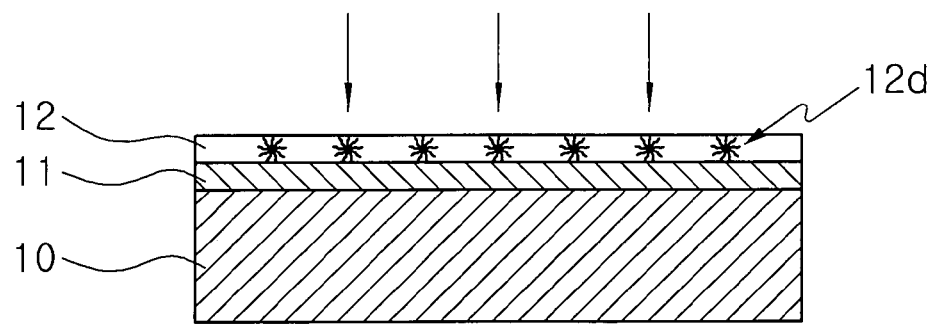
Figure 1D:
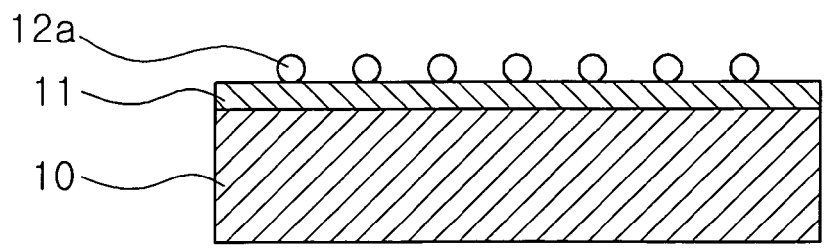
Figure 1E:
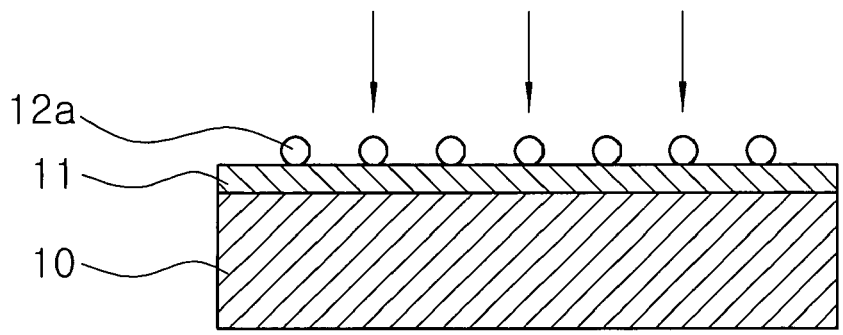
Figure 1F:
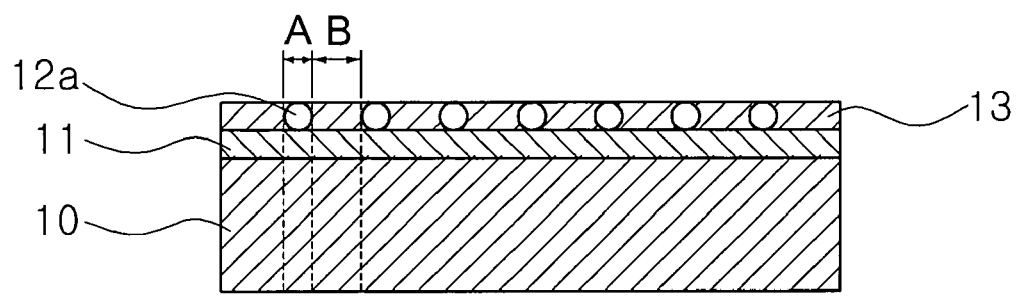
Figure 1G:
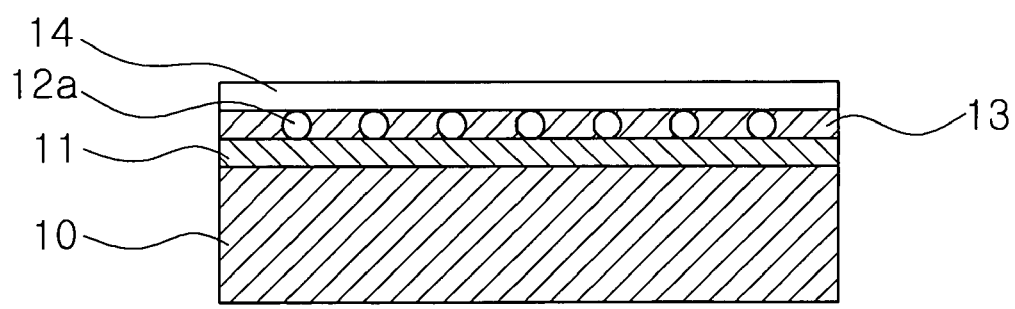
Figure 1H:
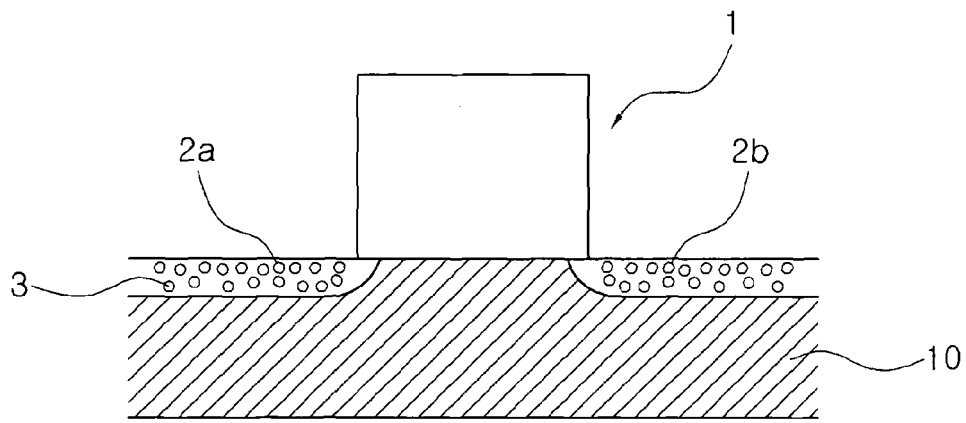

For example, as illustrated in FIG. 1H, a first impurity area 2a and a second impurity area 2b which are doped with impurities 3, that is, dopants are provided on the silicon substrate 10. A channel area is formed on the silicon substrate 10 between the first impurity area 2a and the second impurity area 23b. A gate structure 1 is formed on the channel area.

The gate structure 1 includes a tunnel oxide film 11, a floating gate formed of metal nano-crystals, a control oxide film 13 and a control gate 14.

As illustrated in FIG. 1B, a gate formation solution 12 is coated on the tunnel oxide film 11.

Figure 2:
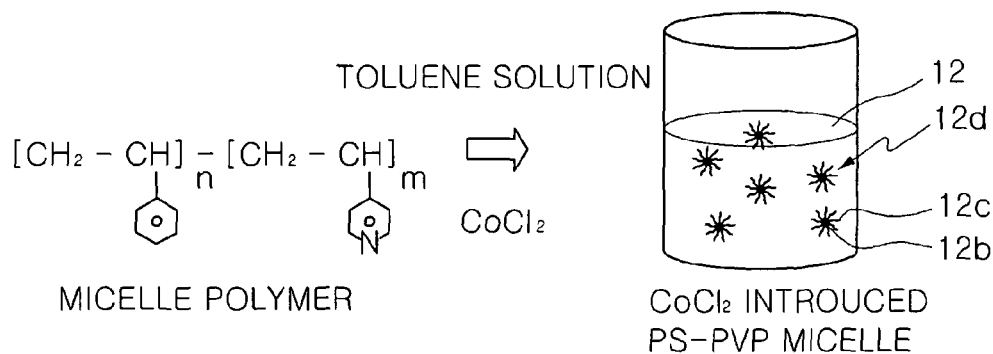
FIG. 2 is a diagram for explaining a gate formation solution applied in a preferable embodiment of the present invention.

FIG. 2 is a diagram for explaining a gate formation solution applied in a preferable embodiment of the present invention.

Referring to FIG. 2, a micelle polymer that is formed of a polymer is put into a toluene solution to thereby form a plurality of micelles 12d, each having a nano-structure.

The micelles 12d included in the gate formation solution 12 are formed by a self-assembly method, to synthesize metal nano-crystals 12a of nano-size.

That is, the metal nano-crystals 12a used as a floating gate of a non-volatile memory device according to the present invention can be synthesized by introducing precursors into the nano-structures of micelle templates 12c which are formed by a self-assembly method.

A micelle polymer tends to phase-separate respective blocks into respective domains due to a restriction of a covalent bond junction between a pair of blocks, that is, a polystyrene (PS) corona block and a poly(vinyl)pyridine (PVP) core block, unlike a general polymer mixture showing a huge phase separation of several microns, and forms a nano-structure having a size of several nanometers to several hundred nanometers by a self-assembly method.

The micelle polymer can be formed of a polymer of macromolecules as shown in the following chemical formula 1 using a methylene radical, a benzene radical, etc., as an example. The micelle polymer can be also formed of macromolecules which can form the micelles by a self-assembly method.

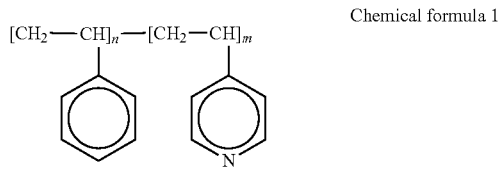

Chemical formula 1

Here, n and m are integers in the chemical formula 1, respectively.

Form and size of the nano-structures which are formed by a self-assembly of the micelle polymer can be decided according to a molecular weight of the micelle polymer, a volumetric ratio of respective blocks thereof, a Flory-Huggins polymer solvent interaction coefficient between the respective blocks thereof, etc.

Hereinbelow, in the detailed description of the present invention, form and size of the nano-structures, that is, form and size of the synthesized metal nano-crystals 12a are controlled by controlling the molecular weight of the micelle polymer, to thereby control density thereof. However, a volumetric ratio of respective blocks, or a Flory-Huggins polymer solvent interaction coefficient between the respective blocks can be controlled, to thereby control form and size of the metal nano-crystals 12a, which does not depart from the technological scope of this invention.

The nano-structures which are formed by a self-assembly of the micelle polymer may be formed into a plate shape, a gyroidal shape, a cylindrical shape, a spherical or hemispherical shape. Form and size of the nano-structures which are formed by the micelle templates 12c can be controlled by controlling the molecular weight of the micelle polymer.

The most suitable form of the metal nano-crystals 12a for use as the floating gate is preferably circular on a plane. This is because it is easy to charge and keep electric charges when the metal nano-crystals 12a are circular on a plane.

In addition, in order to arrange micelles 12d of the nano-structure on a substrate such as a silicon substrate 10, it is preferable to use the micelle templates 12c of the nano-structures that are controlled in a thin film of the micelle polymer.

That is, the micelles 12d can be arranged on a substrate such as a silicon substrate 10, using strong affinity between PVP core blocks of PS-PVP (polystyrene-poly(vinyl pyridine)) micelles and the substrate such as the silicon substrate 10.

Meanwhile, a precursor 12b that can synthesize metal nano-crystals 12a, for example, cobalt chloride ($CoCl_2$) is put in a toluene solution. Accordingly, the cobalt chloride ($CoCl_2$) is selectively introduced into a plurality of blocks which are formed by the micelle polymer in the toluene solution, that is, the PVP core blocks of the PS-PVP micelles.

That is, the precursor 12b of a nano-particle, for example, cobalt chloride is selectively introduced into the PVP core block of the micelle 12d that is formed of a PS corona block that is dissolved in a solvent and a PVP core block which is not dissolved in a solvent and has a nano-structure. Accordingly, metallic salts of a nano-size, that is, metal nano-crystals 12a are synthesized.

Then, as illustrated in FIG. 1B, the toluene solution containing the micelle 12d into which cobalt chloride is selectively introduced to thus synthesize the metal nano-crystals 12a, that is, a gate formation solution 12 is conformally coated on a tunnel oxide film 11.

Here, the gate formation solution 12 may be coated on the tunnel oxide film 11 by a spin coating, dip coating, spray coating, a flow coating or a screen print method. It is preferable to coat the gate formation solution 12 on the tunnel oxide film 11 by the spin coating or dip coating method.

As illustrated in FIG. 1C, after the gate formation solution 12 has been coated on the tunnel oxide film 11, the high molecule micelle templates 12c are removed.

The micelle templates 12c may be removed through a plasma process, for example, an oxygen plasma process or a heat treatment process, for example, an oxygen atmosphere heat treatment process. Otherwise, the micelle template 12c may be removed through a well-known method of removing a high molecule polymer.

The oxygen plasma process is a process of performing plasma processing for about 10 minutes at 100 W after making oxygen flow to a MFC (Mass Flow Controller) by 10 sccms (Standard Cubic Centimeter per Minute) in CVD (chemical vapor deposition) equipment, and keeping pressure therein, and the oxygen atmosphere heat treatment process is a process of removing a high molecule polymer under an oxygen atmosphere in a high-temperature state.

Hereinbelow, in the detailed description of the present invention, the micelle templates 12c are removed through the oxygen plasma process. However, the micelle templates 12c may be removed identically by other methods.

If the metal nano-crystals 12a are synthesized by the cobalt chloride which is the precursor 12b which has been selectively introduced into the PVP core block of the micelle templates 12c included in the gate formation solution 12, and the micelle templates 12c are removed through the oxygen plasma process, the synthesized metals nano-crystals 12a are arranged on the tunnel oxide film 11.

Here, the metal nano-crystals 12a synthesized by the cobalt chloride which is the precursor 12b which has been selectively introduced into the PVP core block are oxidized into cobalt oxide ($Co_3O_4$) that is metal oxide by an oxygen plasma process.

Here, the high molecule polymer of the micelle template 12c that has been included in the gate formation solution 12 and has been arranged on the tunnel oxide film 11 is an organic matter composed of carbon atoms (C) and hydrogen atoms (H), and thus is removed in the form of water and carbon dioxide by the oxygen plasma process.

Therefore, if the oxygen plasma process has been performed, only the metal nano-crystals 12a remain on the tunnel oxide film 11 as illustrated in FIG. 1D.

Figure 3:
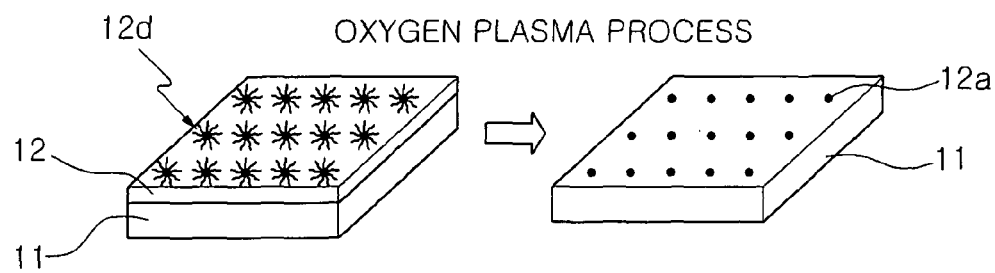
FIG. 3 is a diagram for explaining a synthesis of metal nano-crystals according to a preferable embodiment of the present invention.

FIG. 3 is a diagram for explaining a synthesis of metal nano-crystals according to a preferable embodiment of the present invention.

Referring to FIG. 3, if the high molecule micelle templates 12c are removed through the oxygen plasma process, at the state where the gate formation solution 12 including the micelle templates 12c which synthesize the metal nano-crystals 12a when the precursor 12b such as cobalt chloride is selectively introduced into the PVP core block, has been coated on the tunnel oxide film 11, it can be seen that only the metal nano-crystals 12a which are metal oxide are arranged on the tunnel oxide film 11.

The metal nano-crystals 12a may be arranged in a predetermined pattern on the tunnel oxide film 11.

Here, in the case that a block having a functional radical such as a carboxyl radical (—COOH) or a sulfone radical (—$SO_3$H) forms the nano-structures of micelles 12d, the metallic salt, for example, cobalt chloride can be introduced into the micelle 12d through an ion exchange reaction. Accordingly, the metal nano-crystals 12a can be synthesized while altering a kind of the metallic salt to be introduced and a post-treatment reaction.

In addition, because a functional radical that forms a block is reproduced after having synthesized the metal nano-crystals 12a, introduction of the precursor 12b and a nano-crystal formation reaction are repeated, to thus control size and quantity of the metal nano-crystals 12a, as well as to introduce another kind of a metallic salt and synthesize another ingredient of metal nano-crystals 12a.

Then, as illustrated in FIG. 1E, if the metal nano-crystals 12a are oxidized through the oxygen plasma process or the oxygen atmosphere heat treatment process after the metal nano-crystals 12a have been arranged on the tunnel oxide film 11, the metal nano-crystals 12a which are metal oxide are reduced through a hydrogen atmosphere heat treatment process or a hydrogen plasma process.

The hydrogen atmosphere heat treatment process may proceed for about 30 minutes at hydrogen pressure of 20 mtorr and at 300° C. and thus, metal oxide that has been oxidized through the hydrogen atmosphere heat treatment process is reduced, to thereby obtain the nano-crystals 12a which are formed of metal.

In the detailed description of this invention, the case that cobalt chloride is used as the metallic salt which is the precursor 12b has been described when the metal nano-crystals 12a are formed into cobalt oxide. However, the metal nano-crystals 12a may be formed using a metallic salt formed of any one metal among Fe, Ni, Cr, Au, Ag, Cu, Al, Pt, Sn, W, Ru and Cd, other than Co.

In the case that metal nano-crystals 12a are synthesized using metal such as cobalt or nickel, for example, the metal is oxidized in the oxygen plasma process or the oxygen heat treatment process that removes the micelle template 12c.

Accordingly, the metal nano-crystals 12a are reduced through the hydrogen atmosphere heat treatment process or the hydrogen plasma process in order to enhance an electrical characteristic of the metal nano-crystals 12a.

That is, if the metal nano-crystals 12a are oxidized in a process of removing the micelle templates 12c, the metal nano-crystals 12a are reduced through the hydrogen atmosphere heat treatment process or the hydrogen plasma process in order to enhance an electrical characteristic of the oxidized metal nano-crystals 12a. This is because the electrical characteristic of the oxidized metal nano-crystals 12a which can make electrons flow in or out is weaker than that of the reduced metal nano-crystals 12a.

Meanwhile, in the case that metal nano-crystals 12a are synthesized using the precious metals such as Au or Pt, for example, the metals are not oxidized in the oxygen plasma process or the oxygen heat treatment process that removes the micelle templates 12c. Accordingly, the process of reducing the metal nano-crystals 12a, that is, the hydrogen atmosphere heat treatment process or hydrogen plasma process is not needed.

For example, in the case that the metal nano-crystals 12a are synthesized using the metals which are oxidized through the oxygen plasma process, the metal nano-crystals 12a are reduced through the hydrogen atmosphere heat treatment process. However, in the case that the metal nano-crystals 12a are synthesized using the precious metals which are not oxidized through the oxygen plasma process, the hydrogen atmosphere heat treatment process is not performed but the next process, that is, a process of evaporating a control oxide film 13 is performed.

Then, as illustrated in FIG. 1F, the control oxide film 13 is evaporated, after the metal nano-crystals 12a on the tunnel oxide film 11 have been reduced.

The oxide film of the non-volatile memory device according to the present invention, that is, the tunnel oxide film 11 and the control oxide film 13 can be evaporated using a hafnium oxide film, a silicon dioxide film or an aluminum oxide film.

Among them, the dielectric constant of the hafnium oxide film is larger than that of the generally applicable silicon oxide film or silicon oxynitride film. Accordingly, the hafnium oxide film can form a larger electric field at an identical voltage.

Then, a control gate layer 14 is evaporated on the control oxide film 13, to thereby form a control gate.

The control oxide film 13 performs the same function as that of a dielectric film in an existing MOS (Metal-Oxide-Semiconductor) structure. An area "B" where the metal nano-crystals 12a are not arranged on the tunnel oxide film 11 can be substantially linked with the control oxide film 13.

The area "B" where the metal nano-crystals 12a are not arranged has a metal-oxide-semiconductor (MOS) structure, and an area "A" where the metal nano-crystals 12a are arranged has a metal gate-oxide (control oxide film 13)-metal nano-crystal 12a-oxide (tunnel oxide film 11)-semiconductor structure.

Therefore, an appropriate voltage is applied between the control gate 14 and the substrate in the area "A" where the metal nano-crystals 12a are arranged, to thus make electrons flow in and out with respect to the metal nano-crystals 12a and to thereby program/erase data. The control oxide film 13 and the tunnel oxide film 11 maintain electrons charged in the metal nano-crystals 12a formed as a floating gate.

In addition, as the area "A" where the metal nano-crystals 12a are arranged on the tunnel oxide film 11 is wider, the characteristic of the non-volatile memory device, that is, the flash memory device can be enhanced. Accordingly, it is desirable that the metal nano-crystals 12a are arranged on the tunnel oxide film 11 with a great density at maximum.

The density that the metal nano-crystals 12a are arranged on the tunnel oxide film 11 is closely related to size and form of the metal nano-crystals 12a. Accordingly, if the molecular weight of the micelle polymer to control size and form of the synthesized metal nano-crystals 12a, the alignment density of the metal nano-crystals 12a can be controlled to become the maximum value. Here, density of the metal nano-crystals 12a is established as $10^{12}$ cm$^{-2}$ or more.

That is, the size control of the metal nano-crystals 12a can be controlled by controlling the molecular weight of the PVP core block, or the quantity of the precursor 12b introduced into the PVP core block. The interval of the metal nano-crystals 12a can be controlled by controlling the molecular weight of the PS corona block. The density of the metal nano-crystals 12a can be controlled by controlling the molecular weights of the PS corona block and the PVP core block of the micelle polymer.

Then, as illustrated in FIG. 1G, the control gate 14 is formed on the control oxide film 13.

Figure 4A:
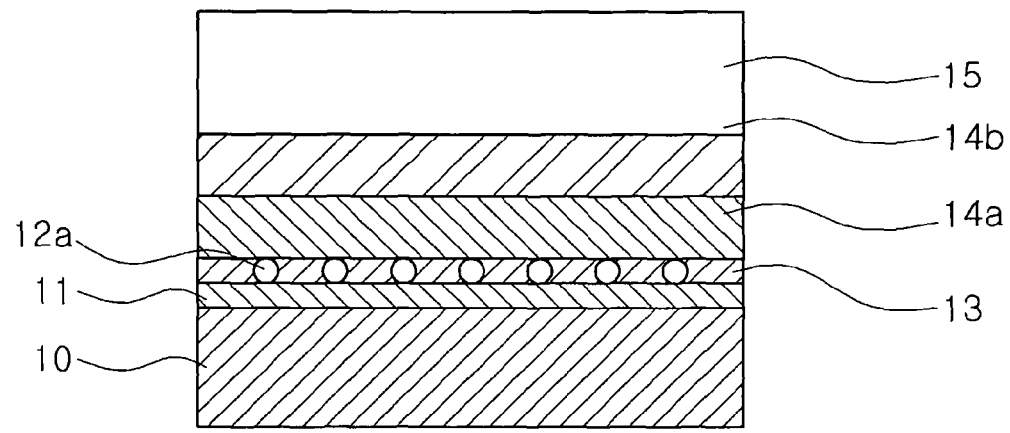
FIGS. 4A to 4C are cross-sectional views for explaining a method of forming a control gate of a non-volatile memory device according to the present invention, respectively.
Figure 4B:
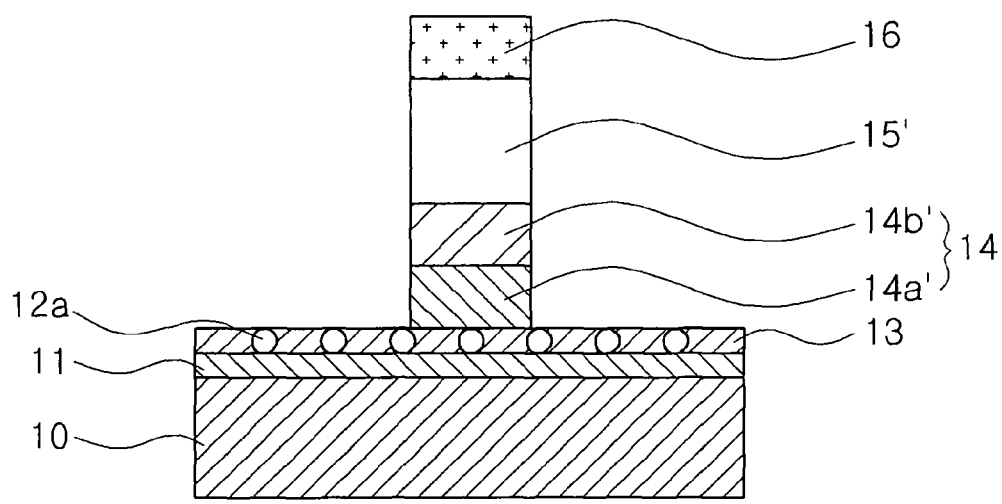
Figure 4C:
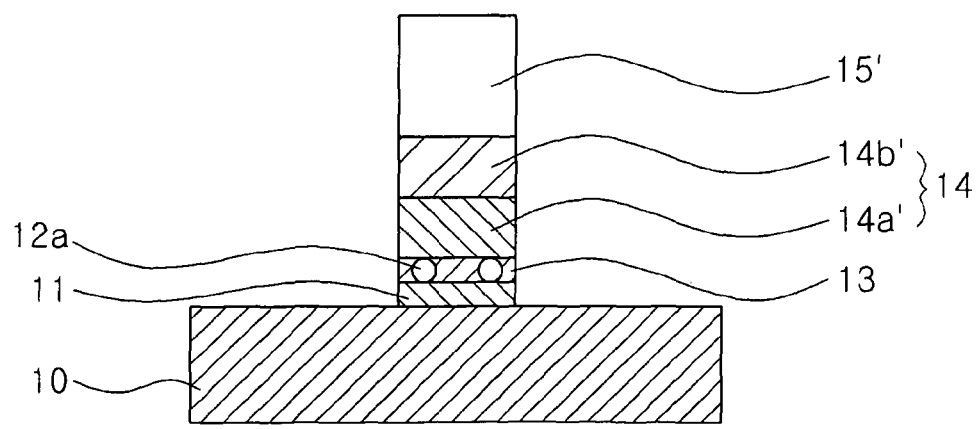

FIGS. 4A to 4C are cross-sectional views for explaining a method of forming a control gate of a non-volatile memory device according to the present invention, respectively.

Referring to FIG. 4A, a tunnel oxide film 11, metal nano-crystals 12a and a control oxide film 13 are formed on a silicon substrate 10 that is a semiconductor substrate. Then, a polysilicon layer 14a, a metallic material layer 14b and a hard mask layer 15 which are used as a conductive film are sequentially formed.

It is desirable to form the metallic material layer 14b using WSix, W, CoSix, TiSix, etc.

Then, referring to FIG. 4B, a photoresist pattern 16 where a word line area is closed is formed on the hard mask layer 15, through a mask work of a control gate 14. Then, the hard mask layer 15, the metallic material layer 14b, and the polysilicon layer 14a are sequentially etched, by a dry etch process which uses the photoresist pattern 16 as an etch mask, to thereby form the control gate 14 in which a polysilicon layer 14a' and a metallic material layer 14b' are deposited.

Referring to FIG. 4C, after removing the photoresist pattern 16, the exposed portion of the control oxide film 13 and the exposed portion of the patterned tunnel oxide film 11 are etched through a self-alignment etch process which uses the hard mask layer 15' of a cell area as an etch barrier, to thus form the control gate 14.

Here, the metal nano-crystals 12a in the exposed portion that is not patterned in the tunnel oxide film 11 are removed through a cleaning process after an etch process, or can remain on the tunnel oxide film 11. In this case, the metal nano-crystals 12a that remain on the tunnel oxide film 11 do not affect in the memory characteristic of the non-volatile memory since the tunnel oxide film 11 that is the dielectric film is etched.

Instead of the above-described control gate formation method, it can be seen that the control gate may be formed using any one of the other known control gate formation methods.

Figure 5A:
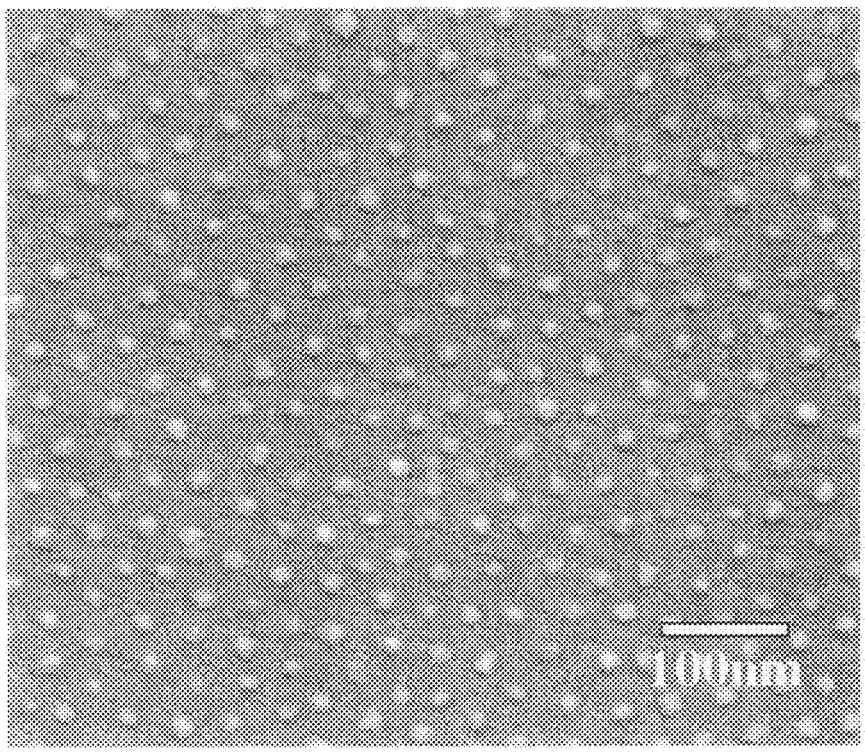
FIGS. 5A and 5B are photographs of Scanning Electron Microscopy (SEM) illustrating a state that metal nano-crystals which are formed while changing a molecular weight of micelle polymer are arranged on a tunnel oxide film, according to an embodiment of the present invention, respectively.
Figure 5B:
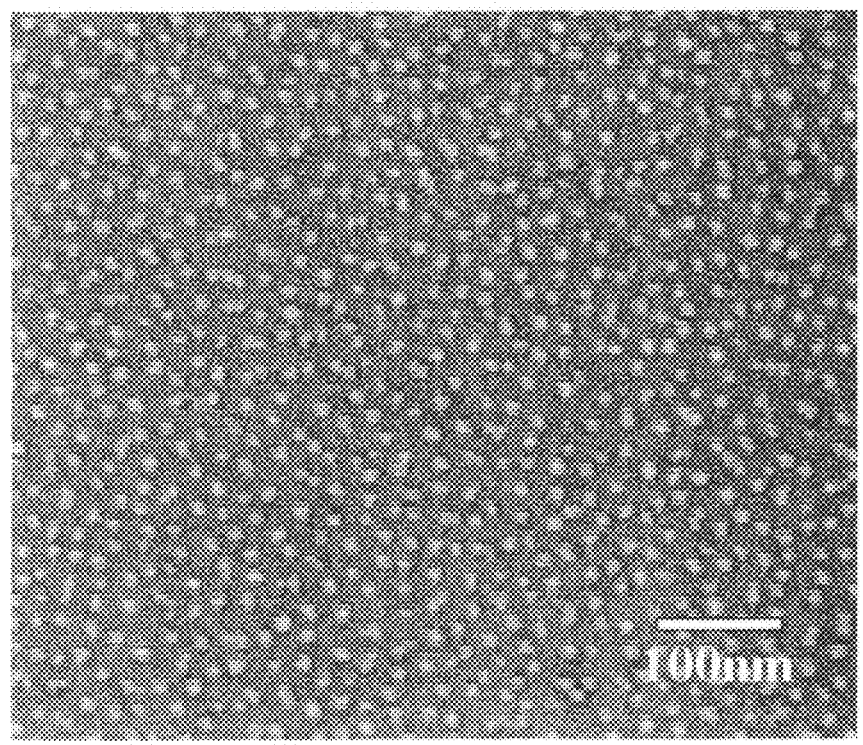

FIGS. 5A and 5B are photographs of Scanning Electron Microscopy (SEM) illustrating a state that metal nano-crystals which are formed while changing a molecular weight of a micelle polymer are arranged on a tunnel oxide film, according to an embodiment of the present invention, respectively.

As illustrated in FIG. 5A, where in the micelle polymer, a number average molecular weights $M_N^{PS}$ of a polystyrene (PS) corona block is set to 47.6 kg/mol and a number average molecular weights $M_N^{PVP}$ of a poly(vinyl)pyridine (PVP) core block is set to 20.9 kg/mol (Polydispersity index=1.14), and the metal nano-crystals 12a are arranged on the tunnel oxide film 11, density of the metal nano-crystals 12a has been measured as $6.99 \times 10^{10}$ cm$^{-2}$.

Meanwhile, as illustrated in FIG. 5B, where in the micelle polymer, a number average molecular weights $M_N^{PS}$ of the PS corona block is set to 31.9 kg/mol and a number average molecular weights $M_N^{PVP}$ of the PVP core block is set to 13.2 kg/mol (Polydispersity index=1.08), and the metal nano-crystals 12a are arranged on the tunnel oxide film 11, density of the metal nano-crystals 12a has been measured as $1.69 \times 10^{11}$ cm$^{-2}$.

As described above with reference to FIGS. 5A and 5B, if the molecular weight of the micelle polymer is controlled, size and form of the metal nano-crystals 12a are controlled. Accordingly, it can be seen that density of the metal nano-crystals 12a that are arranged on the tunnel oxide film 11 can be also controlled.

That is, the size control of the metal nano-crystals 12a can be controlled by controlling the molecular weight of the PVP core block to thereby control the nano-structure size of the micelle template 12c or controlling the quantity of the precursor 12b that is introduced into the PVP core block.

In addition, the interval of the metal nano-crystals 12a can be controlled by controlling the molecular weight of the PS corona block. Accordingly, the density of the metal nano-crystals 12a can be controlled by controlling the molecular weights of the PS corona block and PVP core block in the micelle polymer.

Therefore, the density of the metal nano-crystals 12a can be established as $10^{10}$ cm$^{-2}$ or more by controlling the molecular weight of the micelle polymer.

Figure 6:
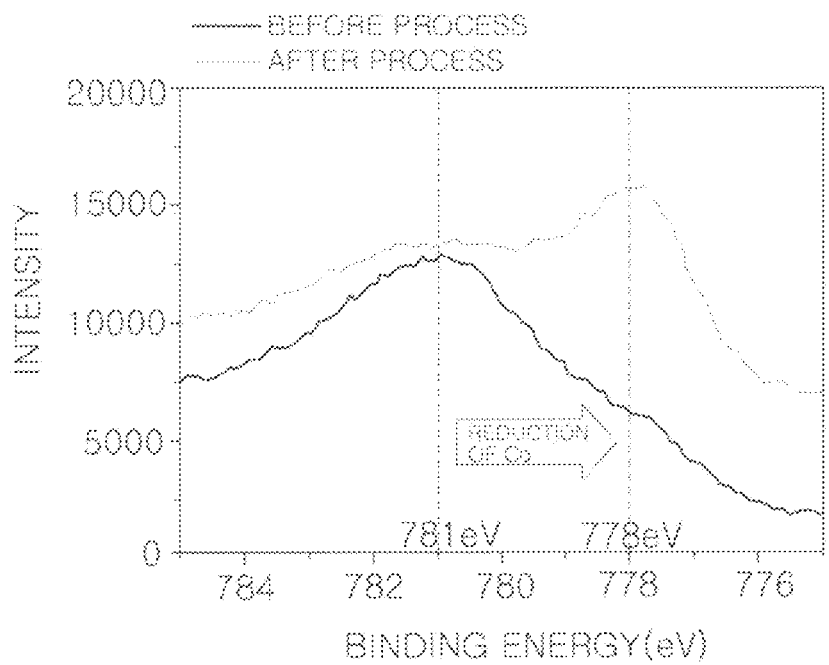
FIG. 6 is a graphical view for explaining a state of metal nano-crystals before and after performing a heat treatment process under a hydrogen atmosphere according to the present invention.

FIG. 6 is a graphical view for explaining a state of metal nano-crystals before and after performing a heat treatment process under a hydrogen atmosphere according to the present invention.

FIG. 6 shows graphs which illustrate measurements which are measured by XPS (X-ray Photoelectron Spectroscopy) method before and after performing a heat treatment process under a hydrogen atmosphere which proceeds for about 30 minutes at hydrogen pressure of 20 mtorr and at 300° C. Before the hydrogen atmosphere heat treatment process, $2p_{3/2}$ peak of the metal nano-crystals 12a which are cobalt oxide appears at 781 eV (electron-volt), and this clarifies that the metal nano-crystals 12a have been oxidized.

Meanwhile, after the hydrogen atmosphere heat treatment process, $2p_{3/2}$ peak of the metal nano-crystals 12a appears at 778 eV (electron-volt), and this clarifies that the metal nano-crystals 12a have been reduced.

Therefore, it can be seen that the metal nano-crystals 12a of oxide state have been reduced through the hydrogen atmosphere heat treatment process, and thus the hydrogen atmosphere heat treatment process can be used to make electrons flow in or out with respect to the metal nano-crystals 12a. In addition, the oxidized metal nano-crystals 12a are reduced through the hydrogen atmosphere heat treatment process, to thereby enhance the electrical characteristic of making electrons flow in or out with respect to the metal nano-crystals 12a.

Moreover, it can be predicted that the electrical characteristic of the metal nano-crystals 12a that is reduced through the hydrogen plasma process is enhanced.

Figure 7:
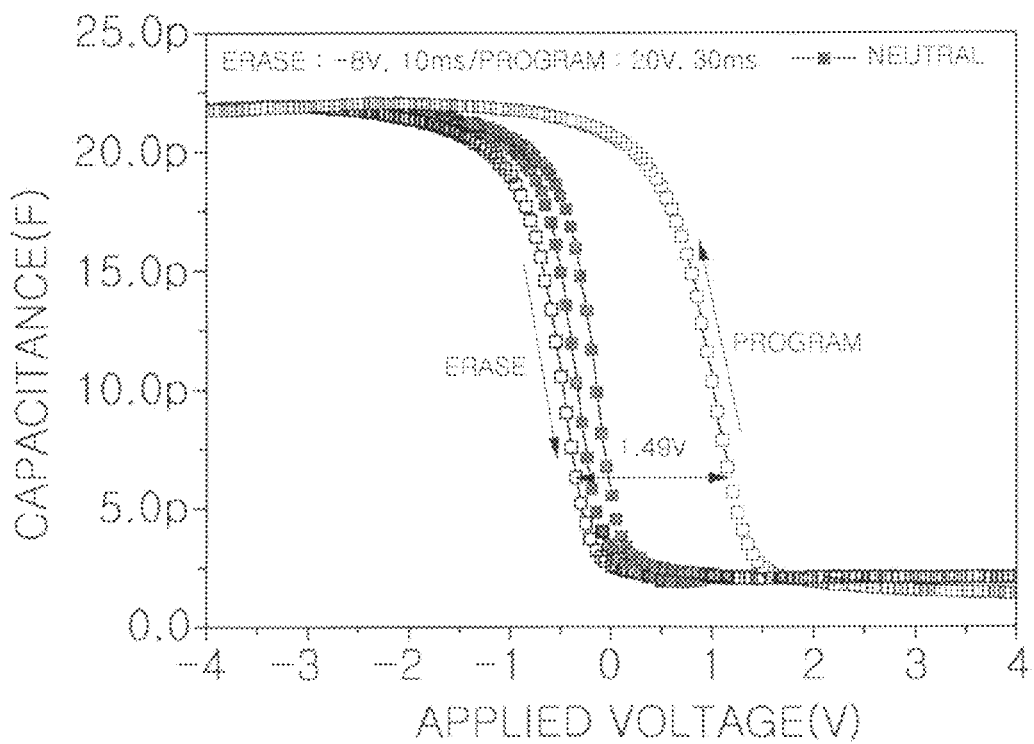
FIG. 7 is a graphical view showing a capacitance corresponding to a voltage applied to a non-volatile memory device where metal nano-crystals are used as a floating gate.

FIG. 7 is a graphical view showing a capacitance corresponding to a voltage applied to a non-volatile memory device where metal nano-crystals are used as a floating gate.

FIG. 7 illustrates capacitance measurement graphs in which the metal nano-crystals 12a are reduced through the hydrogen atmosphere heat treatment process, the control oxide film 13 and the control gate 14 are evaporated, and then the capacitance is measured by change of the applied voltage. Here, it can be seen that the flat-band voltage which is measured while erasing for 10 ms at −8V and the flat-band voltage which is measured while programming for 30 ms at 20V differ by about 1.49V from each other.

Therefore, if the metal nano-crystals 12a are used as the floating gate, it can be seen that data can be programmed or erased. It can be seen that the non-volatile memory device where the metal nano-crystals 12a are manufactured as the floating gate can operate.

Figure 8:
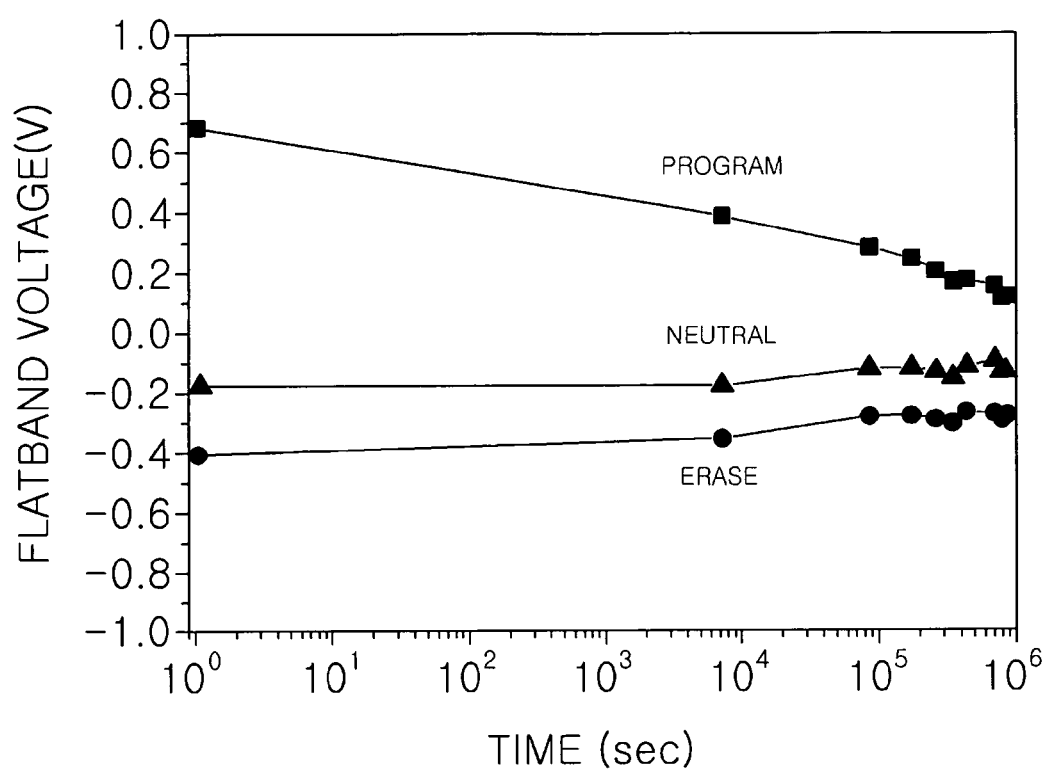
FIG. 8 is a graphical view showing a flat voltage change by a time change of a non-volatile memory device where metal nano-crystals are manufactured as a floating gate.

FIG. 8 is a graphical view showing a flat-band voltage change by a time change of a non-volatile memory device where metal nano-crystals are manufactured as a floating gate.

As illustrated in FIG. 8, after data has been programmed in and erased from the non-volatile memory device that has been manufactured using the metal nano-crystals 12a as the floating gate, capacitance is measured for a given time to thus calculate a flat-band voltage. When reviewing the calculated flat-band voltage, it can be seen that the flat-band voltage is changed after about 2 hours has passed since data has been initially programmed, but a certain value is maintained thereafter.

Therefore, if data is stored (i.e., programmed) in the non-volatile memory device that has been manufactured using the metal nano-crystals 12a as the floating gate, data is not erased even if time passes. Accordingly, it can be seen that the non-volatile characteristic of the memory device can be maintained.

Meanwhile, as described above, size and density of the metal nano-crystals 12a are controlled by controlling the molecular weight of the micelle polymer, to thus form a floating electrode of a thin film transistor-liquid crystal display.

For example, when a gate electrode and a floating electrode are formed on an insulation substrate in a process of making a thin film transistor-liquid crystal display, the floating electrode can be formed using the metal nano-crystals 12a which are synthesized according to the precursor 12b selectively introduced in the nano-structure of the micelle polymer. Since the process of making a thin film transistor-liquid crystal display is well-known, the detailed description thereof will be omitted.

Therefore, when making the thin film transistor-liquid crystal display, the metal nano-crystals 12a that are synthesized through the self-assembled micelle polymer which can easily control size and density of the metal nano-crystals 12a, can be used.

That is, the metal nano-crystals 12a are synthesized in the toluene solution through introduction of the precursor 12b and the post-process at the state where the micelle polymer has been put into the toluene solution, to thereby form a floating electrode.

As described above, the present invention can easily control density and size of a floating gate in a non-volatile memory device, and the floating gate can be formed using nano-crystals of nano-size.

In addition, according to this invention, nano-crystals are formed using the self-assembled micelle. Accordingly, a problem such as a change in a membranous feature due to a high-temperature heat treatment process can be prevented beforehand.

In addition, according to the present invention, a tunnel oxide film or a control oxide film is formed as a hafnium oxide film having a high dielectric constant. Accordingly, a higher electric field can be applied under an identical voltage, than that of an existing non-volatile memory device, to thereby enhance characteristics of the memory device.

The present invention is not limited to the above-described embodiments. It is apparent to one who has an ordinary skill in the art that there may be many modifications and variations within the same technical spirit of the invention.

What is claimed is:

1. A method of forming a floating gate on a semiconductor substrate comprising the steps of:
   forming a tunnel oxide film on the semiconductor substrate;
   coating a gate formation solution on the tunnel oxide film in which the gate formation solution includes a plurality of micelle templates formed by a self-assembly method wherein precursors capable of synthesizing metallic salts are introduced in the plurality of micelle templates; and
   arranging the metallic salts on the tunnel oxide film by removing the micelle templates, to thereby form the floating gate.

2. The floating gate formation method of claim 1, wherein the micelle templates are removed through a plasma process that applies plasma or a heat treatment process.

3. The floating gate formation method of claim 2, further comprising the step of reducing the metallic salts in the case that the metallic salts have been oxidized through the plasma process or heat treatment process.

4. The floating gate formation method of claim 3, wherein the step of reducing the metallic salts is performed through any one of a heat treatment process under a hydrogen atmosphere and a process of applying hydrogen plasma.

5. The floating gate formation method of claim 1, wherein the tunnel oxide film is formed of any one among a hafnium oxide ($HfO_2$) film, a silicon dioxide ($SiO_2$) film and an aluminum oxide ($Al_2O_3$) film.

6. The floating gate formation method of claim 1, wherein the precursors are a material that can synthesize the metallic salts formed of any one metal among Co, Fe, Ni, Cr, Au, Ag, Cu, Al, Pt, Sn, W, Ru and Cd.

7. The floating gate formation method of claim 1, wherein the metallic salts are metal nano-crystals which are synthesized by projecting a micelle polymer that can form the micelle templates by a self-assembly method into a toluene solution including the precursors so that each of the precursors are introduced in each of the micelle templates having a nano-structure.

8. The floating gate formation method of claim 7, wherein a density of the metal nano-crystals are controlled by controlling a corona block molecular weight or core block molecular weight of the micelle polymer.

9. The floating gate formation method of claim 1, wherein the floating gate is applied to a floating gate of a non-volatile memory or a floating electrode of a thin film transistor-liquid crystal display (TFT-LCD), the non-volatile memory being a flash memory.

10. The floating gate formation method of claim 9, wherein the gate formation solution is obtained by projecting a micelle polymer that forms the micelle templates by a self-assembly method into a toluene solution including the precursors, so that each of the precursors are introduced in each of the micelle templates having a nano-structure.

11. A process of manufacturing a non-volatile memory device comprising the steps of:
    forming a tunnel oxide film on a semiconductor substrate;
    coating a gate formation solution on the tunnel oxide film in which the gate formation solution includes a plurality of micelle templates formed by a self-assembly method wherein precursors capable of synthesizing metallic salts are introduced in the plurality of micelle templates;
    arranging a plurality of metal nano-crystals synthesized with the metallic salts on the tunnel oxide film by removing the micelle templates;
    forming a control oxide film on the tunnel oxide film and the metal nano-crystal; and
    forming a control gate on the control oxide film.

12. The method of manufacturing the non-volatile memory device of claim 11, further comprising the steps of reducing the metallic nano-crystals through a heat treatment process under a hydrogen atmosphere or a hydrogen plasma process in the case that the metal nano-crystals have been oxidized by removing the micelle templates through a plasma process or heat treatment process.

13. The method of manufacturing the non-volatile memory device of claim 11, wherein the gate formation solution includes the metal nano-crystals which are synthesized by projecting a micelle polymer that can form the micelle templates by a self-assembly method into a toluene solution including the precursors so that the precursors are selectively introduced in respective core blocks of the micelle templates.

14. The method of manufacturing the non-volatile memory device of claim 11, wherein the precursors are a material that can synthesize the metallic salts formed of any one metal among Co, Fe, Ni, Cr, Au, Ag, Cu, Al, Pt, Sn, W, Ru and Cd.

15. The method of manufacturing the non-volatile memory device of claim 11, wherein a density of the metal nano-crystals is controlled by controlling a corona block molecular weight or core block molecular weight of the micelle polymer which can be formed by a self-assembly method.

* * * * *